(12) United States Patent
Qing et al.

(10) Patent No.: US 11,183,103 B2
(45) Date of Patent: Nov. 23, 2021

(54) SHIFT REGISTER UNIT AND DRIVING METHOD THEREOF, GATE DRIVING CIRCUIT, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Haigang Qing, Beijing (CN); Wen Tan, Beijing (CN); Yue Long, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 486 days.

(21) Appl. No.: 16/319,623

(22) PCT Filed: May 21, 2018

(86) PCT No.: PCT/CN2018/087619
§ 371 (c)(1),
(2) Date: Jan. 22, 2019

(87) PCT Pub. No.: WO2018/223834
PCT Pub. Date: Dec. 13, 2018

(65) Prior Publication Data
US 2021/0287591 A1 Sep. 16, 2021

(30) Foreign Application Priority Data

Jun. 9, 2017 (CN) .......................... 201710433808.2

(51) Int. Cl.
G09G 3/36 (2006.01)
G09G 3/20 (2006.01)
G11C 19/28 (2006.01)

(52) U.S. Cl.
CPC ........... *G09G 3/2092* (2013.01); *G11C 19/28* (2013.01); *G09G 2310/0286* (2013.01)

(58) Field of Classification Search
CPC .................. G09G 3/20; G09G 3/2092; G09G 2310/0286; G09G 3/36; G09G 3/3677; G11C 19/28; G11C 19/00; G02F 1/1345
See application file for complete search history.

(56) References Cited

U.S. PATENT DOCUMENTS 9,053,678 B2 6/2015 Li et al.
2007/0297559 A1 12/2007 Cho et al.
(Continued)

FOREIGN PATENT DOCUMENTS

CN 102654982 A 9/2012
CN 103413531 A 11/2013
(Continued)

OTHER PUBLICATIONS

The First Chinese Office Action dated Jul. 30, 2019; Appln. No. 201710433808.2.
(Continued)

*Primary Examiner* — Pegeman Karimi

(57) ABSTRACT

A shift register unit includes a control sub-circuit and a noise reduction sub-circuit. The control sub-circuit can control a potential of a pull-down node as a first potential when a first clock signal is the first potential; the noise reduction sub-circuit can control a potential of an output terminal as a second potential when a pull-down node or a second clock signal is the first potential. Since frequencies of the first clock signal and the second clock signal are the same and
(Continued)

phases thereof are opposite, the control sub-circuit and the noise reduction sub-circuit can control the potential of the output terminal as the second potential after the output phase of the shift register unit, so as to guarantee effective noise reduction of the output terminal.

13 Claims, 5 Drawing Sheets

(56) References Cited

U.S. PATENT DOCUMENTS

| | | | |
|---|---|---|---|
| 2016/0275902 A1* | 9/2016 | Xue | G09G 3/3266 |
| 2017/0039968 A1* | 2/2017 | Chen | G09G 3/3677 |
| 2017/0039971 A1 | 2/2017 | Huang | |
| 2017/0153742 A1* | 6/2017 | Pang | G09G 3/2096 |
| 2017/0178558 A1* | 6/2017 | Zhou | G11C 19/28 |
| 2017/0309345 A1 | 10/2017 | Umezaki | |
| 2018/0182345 A1* | 6/2018 | Seong | G09G 3/3614 |

FOREIGN PATENT DOCUMENTS

| | | |
|---|---|---|
| CN | 103474017 A | 12/2013 |
| CN | 103680636 A | 3/2014 |
| CN | 104700805 A | 6/2015 |
| CN | 104810058 A | 7/2015 |
| CN | 106023946 A | 10/2016 |
| CN | 106157923 A | 11/2016 |
| CN | 106991958 A | 7/2017 |
| JP | 2013-069402 A | 4/2013 |
| WO | 2013/026387 A1 | 2/2013 |

OTHER PUBLICATIONS

International Search Report and Written Opinion dated Aug. 15, 2018; PCT/CN2018/087619.

* cited by examiner

SHIFT REGISTER UNIT AND DRIVING METHOD THEREOF, GATE DRIVING CIRCUIT, AND DISPLAY DEVICE

CROSS-REFERENCE TO RELATED APPLICATION

The present application claims the priority of a Chinese patent application No. 201710433808.2 filed on Jun. 9, 2017. Herein, the content disclosed by the Chinese patent application is incorporated in full by reference as a part of the present application.

TECHNICAL FIELD

The present disclosure relates to a field of display technique, in particular to a shift register unit and a driving method thereof, a gate driving circuit and a display apparatus.

BACKGROUND

When displaying an image, a display apparatus needs to utilize a gate driving circuit to scan a pixel array. The gate driving circuit comprises a plurality of shift register units connected in cascades, each of which is corresponding to pixel units of one row in the pixel array. The plurality of shift register units connected in cascades realize progressive scanning drive of pixel units of respective rows in the pixel array of the display apparatus, so as to display images.

There is a shift register unit in the related art. The shift register unit mainly comprises an input sub-circuit, an output sub-circuit and a noise reduction sub-circuit. Herein, the input sub-circuit is configured to input a voltage of an output terminal of a previous row of shift register unit to the shift register unit, and pull up a level of a pull-up node in the shift register unit to a high level; the output sub-circuit is configured to output a gate driving signal to the output terminal of the shift register unit under the control of the pull-up node; the noise reduction sub-circuit is configured to pull down the level of the output terminal of the shift register unit to a low level under the control of a clock signal, so that noise reduction of the output terminal of the shift register unit is realized.

However, since the noise reduction sub-circuit is controlled by the clock signal, transistors in the noise reduction sub-circuit cannot be turned on effectively when the clock signal is at the low level. At this time, the noise reduction sub-circuit cannot pull down the level of the output terminal to the low level effectively. The noise reduction performance of the noise reduction sub-circuit is poor.

SUMMARY

In order to solve the problem of very poor noise reduction performance of a shift register unit in related technologies. There is provided in the present disclosure a shift register unit and a driving method thereof, a gate driving circuit and a display apparatus.

According to an embodiment of the present disclosure, there is provided a shift register unit, comprising: an input sub-circuit, a control sub-circuit, a noise reduction sub-circuit and an output sub-circuit.

Said input sub-circuit is connected to an input signal terminal, a first control signal terminal and a pull-up node respectively, and is configured to output a first control signal from said first control signal terminal to said pull-up node when an input signal output by said input signal terminal is at a first potential.

Said control sub-circuit is connected to said pull-up node, a first clock signal terminal, a second clock signal terminal, a first power supply signal terminal, a second power supply signal terminal and a pull-down node respectively, and is configured to output a second power supply signal from said second power supply signal terminal to said pull-down node when said pull-node is at the first potential, and to output a first power supply signal from said first power supply signal terminal to said pull-down node when a second clock signal output by said second clock signal terminal is at a second potential and a first clock signal output by said first clock signal terminal is at the first potential, wherein said first power supply signal is at the first potential, and said second power supply signal is at the second potential.

Said noise reduction sub-circuit is connected to said pull-down node, said second clock signal terminal, said second power supply signal terminal and an output terminal respectively, and is configured to output said second power supply signal to said output terminal when said pull-down node or said second clock signal terminal is at the first potential, wherein frequencies of said first clock signal and said second clock signal are the same, and phases thereof are opposite.

Said output sub-circuit is connected to said first clock signal terminal, said pull-up node and said output terminal respectively, and is configured to output said first clock signal to said output terminal when said pull-up node is at the first potential.

According to an embodiment of the present disclosure, said input sub-circuit is further connected to a reset signal terminal and a second control signal terminal, and configured to output a second control signal from said second control signal terminal to said pull-up node when a reset signal output by said reset signal terminal is at the first potential, wherein said first control signal is at the first potential, and said second control signal is at the second potential.

According to an embodiment of the present disclosure, said noise reduction sub-circuit is connected to said pull-up node, and configured to output said second power supply signal to said pull-up node when said pull-down node is at the first potential.

According to an embodiment of the present disclosure, said control sub-circuit comprises: a first transistor, a second transistor, a third transistor, a fourth transistor and a fifth transistor; a gate of said first transistor is connected to said second clock signal terminal, a first electrode thereof is connected to said first power supply signal terminal, and a second electrode thereof is connected to a first node; a gate of said second transistor is connected to said first node, a first electrode thereof is connected to said first clock signal terminal, and a second electrode thereof is connected to a gate of said third transistor; a first electrode of said third transistor is connected to said first power supply signal terminal, and a second electrode thereof is connected to said pull-down node; a gate of said fourth transistor is connected to said pull-up node, a first electrode thereof is connected to said second clock signal terminal, and a second electrode thereof is connected to said first node; a gate of said fifth transistor is connected to said pull-up node, a first electrode thereof is connected to said second power supply signal terminal, and a second electrode thereof is connected to said pull-down node.

According to an embodiment of the present disclosure, said noise reduction sub-circuit comprises: a sixth transistor, a seventh transistor and an eighth transistor; a gate of said sixth transistor is connected to said pull-down node, a first electrode thereof is connected to said second power supply signal terminal, and a second electrode thereof is connected to said pull-up node; a gate of said seventh transistor is connected to said pull-down node, a first electrode thereof is connected to said second power supply signal terminal, a second electrode thereof is connected to said output terminal; a gate of said eighth transistor is connected to said second clock signal terminal, a first electrode thereof is connected to said second power supply signal terminal, and a second electrode thereof is connected to said output terminal.

According to an embodiment of the present disclosure, said input sub-circuit comprises: a ninth transistor and a tenth transistor; a gate of said ninth transistor is connected to said input signal terminal, a first electrode thereof is connected to said first control signal terminal, and a second electrode thereof is connected to said pull-up node; a gate of said tenth transistor is connected to said reset signal terminal, a first electrode thereof is connected to said second control signal terminal, and a second electrode thereof is connected to said pull-up node.

According to an embodiment of the present disclosure, said output sub-circuit comprises: an eleventh transistor and a capacitor; a gate of the eleventh transistor is connected to said pull-up node, a first electrode thereof is connected to said first clock signal terminal, and a second electrode thereof is connected to said output terminal; one terminal of said capacitor is connected to said pull-up node, and another terminal thereof is connected to said output terminal.

According to an embodiment of the present disclosure, there is provided a driving method of a shift register unit, comprising: an input sub-circuit, a control sub-circuit, a noise reduction sub-circuit and an output sub-circuit; said method comprises:

during a charging phase, an input signal terminal outputting an input signal being at a first potential, said input sub-circuit outputting a first control signal being at a first potential from a first control signal terminal to a pull-up node to charge said pull-up node under the control of said input signal;

during an output phase, said first clock signal terminal outputting a first clock signal output being at the first potential, said pull-up node maintaining the first potential, and said output sub-circuit outputting said first clock signal to said output terminal under the control of said pull-up node;

during an output noise reduction phase, said first clock signal and said second clock signal being at the first potential in an alternative way; when said first clock signal is at the first potential, said control sub-circuit outputting a first power supply signal being at the first potential from a first power supply signal terminal to said pull-down node, and said noise reduction sub-circuit outputting said second power supply signal to said output terminal under the control of said pull-down node; when said second clock signal is at the first potential, said noise reduction sub-circuit outputting said second power supply signal to said output terminal under the control of said second clock signal.

According to the embodiment of the present disclosure, during said output noise reduction phase, when a reset signal output by said reset signal terminal is at the first potential and a second clock signal output by said second clock signal terminal is at the first potential, said input sub-circuit outputs a second control signal from said second control signal terminal to said pull-up node under the control of said reset signal, said noise reduction sub-circuit outputs a second power supply signal from a second power supply signal terminal to said output terminal under the control of said second clock signal, and both said second control signal and said second power supply signal are at the second potential.

According to the embodiment of the present disclosure, said control sub-circuit comprises: a first transistor, a second transistor, a third transistor, a fourth transistor and a fifth transistor; said noise reduction sub-circuit comprises: a sixth transistor, a seventh transistor and an eighth transistor;

During said output noise reduction phase, said first clock signal and said second clock signal are at the first potential in an alternative way, said second transistor maintains in a turn-on state, said first clock signal terminal outputs said first clock signal to a gate of said third transistor; when said first clock signal is at the first potential, said third transistor is turned on, said first power supply signal terminal outputs said first power supply signal to said pull-down node, said sixth transistor and said seventh transistor are turned on, and said second power supply signal terminal outputs said second power supply signal to said pull-up node and said output terminal respectively; when said second clock signal is at the first potential, said eighth transistor is turned on, and said second power supply signal terminal outputs said second power supply signal to said output terminal.

According to the embodiment of the present disclosure, all transistors are N type transistors, and the first potential is a high potential relative to the second potential.

According to an embodiment of the present disclosure, there is provided a gate driving circuit, comprising: at least two shift register units connected in cascades.

According to an embodiment of the present disclosure, there is provided a display apparatus, comprising: said gate driving circuit as described above.

There are provided in the present disclosure the shift register unit and the driving method thereof, the gate driving circuit and the display apparatus. The shift register unit comprises the control sub-circuit and the noise reduction sub-circuit. The control sub-circuit can control the potential of the pull-down node at the first potential when the first clock signal is at the first potential; the noise reduction sub-circuit can control the potential of the output terminal at the second potential when the pull-down node or the second clock signal is at the first potential. Since frequencies of the first clock signal and the second clock signal are the same and phases thereof are opposite, the control sub-circuit and the noise reduction sub-circuit can control the potential of the output terminal at the second potential after the output phase of the shift register unit, so as to guarantee the effective noise reduction performance of the output terminal.

BRIEF DESCRIPTION OF THE DRAWINGS

In order to describe technical solutions in embodiments of the present disclosure more clearly, accompanying figures that need to be used in description of the embodiments will be introduced simply. Obviously, the accompanying figures in the following description only relate to some embodiments of the present disclosure, but not limitation to the present disclosure. For those ordinary skilled in the art, other accompanying figures can also be obtained according to these accompanying figures without paying any inventive labor.

DETAILED DESCRIPTION

In order to make purposes, technical solutions, and advantages of the present disclosure more clear, technical solutions of embodiments of the present disclosure will be described below clearly and completely by combining with the accompanying figures of the embodiments. Obviously, the embodiments described below are a part of embodiments of the present disclosure, but not all the embodiments. Based on the embodiments of the present disclosure described below, all the other embodiments obtained by those ordinary skilled in the art without paying any inventive labor belong to the scope sought for protection in the present disclosure.

Transistors adopted in all the embodiments of the present disclosure can be thin film transistors or field effect transistors or other devices having the same characteristics. The transistors adopted in the embodiments of the present disclosure are mainly switch transistors according to functions of these transistors in the circuit. Since source and drain of the switch transistor adopted herein are symmetrical, their source and drain can be exchanged with each other. In an embodiments of the present disclosure, a source is referred to as a first electrode, and a drain is referred to as a second electrode. According to forms in the accompanying figures, middle terminal of a transistor is prescribed as a gate, a signal input terminal thereof is a source, and a signal output terminal thereof is a drain. In addition, switch transistors adopted in the embodiments of the present disclosure can comprise any one of P type switch transistors and N type switch transistors, wherein the P type switch transistor is turned on when its gate is at a low level and is turned off when its gate is at a high level; the N type transistor is turned on when its gate is at a high level and is turned off when its gate is at a low level. In addition, a plurality of signals in respective embodiments of the present disclosure are corresponding to a first potential and a second potential. The first potential and the second potential only represent that the potential of the signal has two quantities of state, but do not represent that the first potential or the second potential in the full text has a specific numeric value. In the embodiment of the present disclosure, descriptions are provided below by taking the first potential being at a high potential relative to the second potential as an example.

Figure 1:
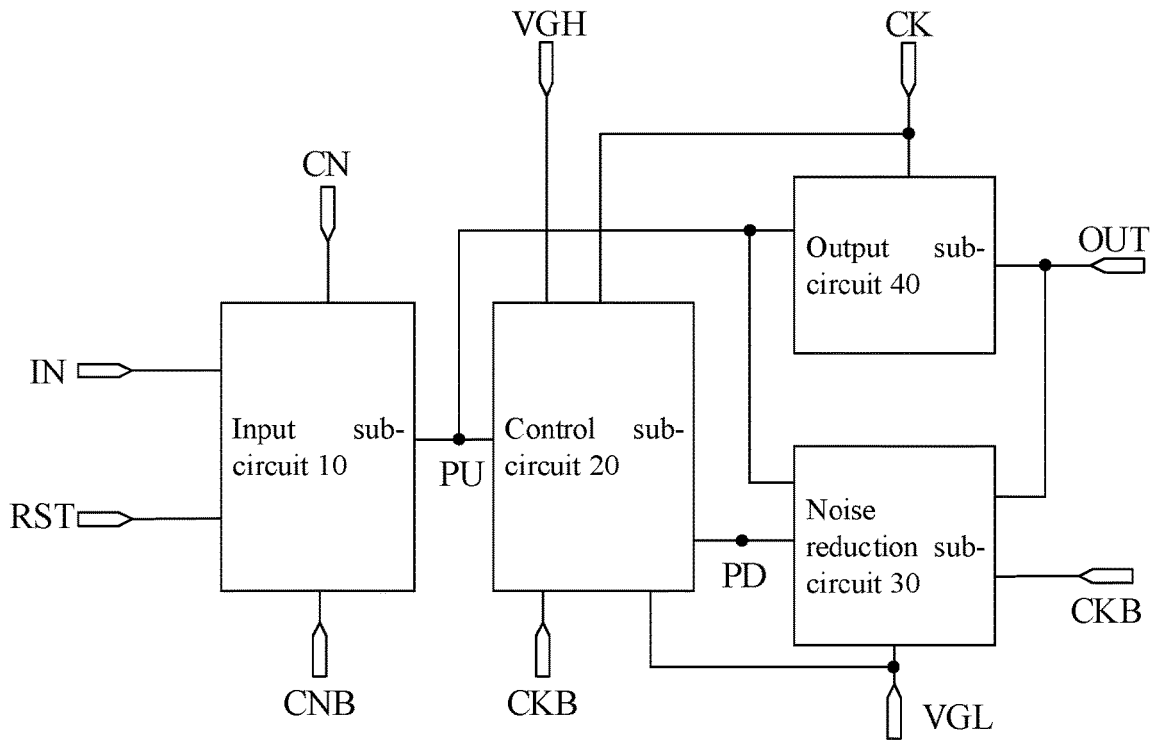
FIG. 1 is a schematic diagram of a structure of a shift register unit provided in an embodiment of the present disclosure.

FIG. 1 is a schematic diagram of a structure of a shift register unit provided in an embodiment of the present disclosure. As shown in FIG. 1, the shift register unit can comprise: an input sub-circuit 10, a control sub-circuit 20, a noise reduction sub-circuit 30 and an output sub-circuit 40.

The input sub-circuit 10 is connected to an input signal terminal IN, a first control signal terminal CN and a pull-up node PU, and configured to output a first control signal from the first control signal terminal CN to the pull-up node PU when an input signal output by the input signal terminal IN is at a first potential, and the first control signal is at the first potential, so that the pull-up node PU can be charged.

Additionally, the input sub-circuit 10 can be further connected to a reset signal terminal RST and a second control signal terminal CNB, and configured to output a second control signal from the second control signal terminal CNB to the pull-up node PU when a reset signal output by the reset signal terminal RST is at the first potential, and the second control signal is at a second potential, so that the pull-up node PU can be reset. Herein, the first control signal is at the first potential, and the second control signal is at the second potential.

The control sub-circuit 20 is connected to the pull-up node PU, a first clock signal terminal CK, a second clock signal terminal CKB, a first power supply signal terminal VGH, a second power supply signal terminal VGL and a pull-down node PD, and configured to output a second power supply signal from the second power supply signal terminal VGL to the pull-down node PD when the pull-up node PU is at the first potential, and to output a first power supply signal from the first power supply signal terminal VGH to the pull-down node PD when a second clock signal output by the second clock signal terminal CKB is at the second potential and a first clock signal output by the first clock signal terminal CK is at the first potential, wherein the first power supply signal is at the first potential, and the second power supply signal is at the second potential.

The noise reduction sub-circuit 30 is connected to the pull-down node PD, the second clock signal terminal CKB, the second power supply signal terminal VGL and an output terminal OUT respectively, and is configured to output the second power supply signal to the output terminal OUT when the pull-down node PD or the second clock signal terminal CKB is at the first potential, so as to reduce the noise of the output terminal OUT. Herein, frequencies of the first clock signal and the second clock signal are the same, and phases thereof are opposite (i.e., a phase difference of 180°).

In addition, the noise reduction sub-circuit 30 can further be connected to the pull-up node PU, and is configured to output the second power supply signal to the pull-up node PU when the pull-down node PD is at the first potential.

The output sub-circuit 40 is connected to the first clock signal terminal CK, the pull-up node PU and the output terminal OUT respectively, and is configured to output the first clock signal to the output terminal OUT when the pull-up node PU is at the first potential. The first clock signal output by the output sub-circuit 40 is a gate driving signal used for driving pixel units of one row.

Figure 2:
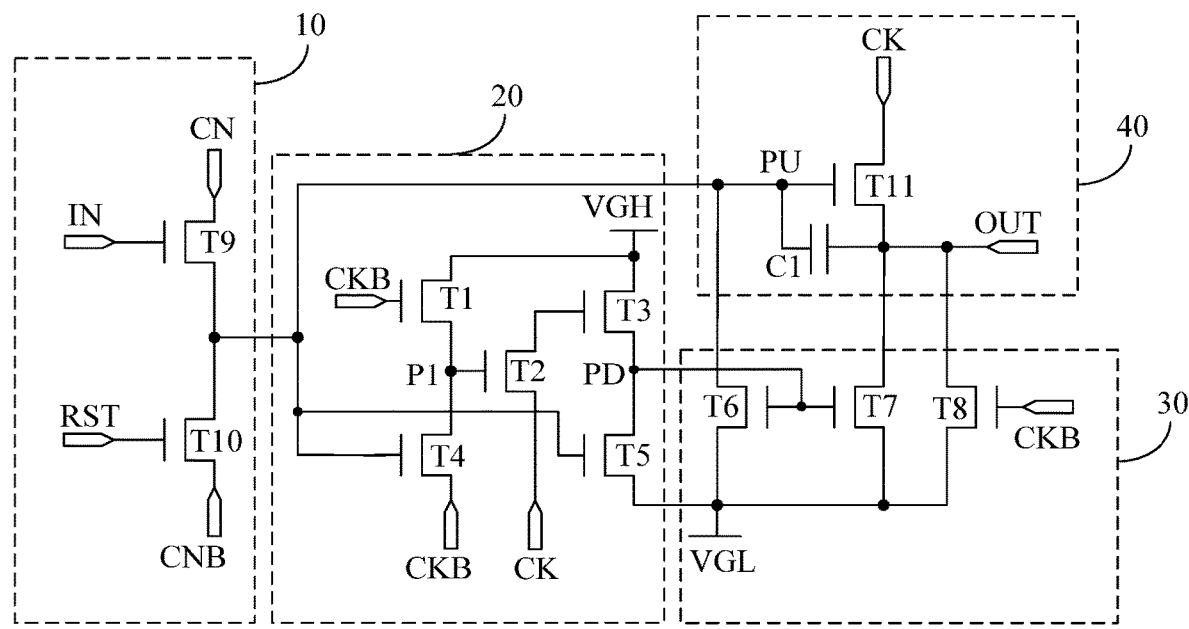
FIG. 2 is a schematic diagram of a structure of a shift register unit provided in an embodiment of the present disclosure.

FIG. 2 is a schematic diagram of a structure of a shift register unit provided in an embodiment of the present disclosure. By referring to FIG. 2, the control sub-circuit 20 can in particular comprise: a first transistor T1, a second transistor T2, a third transistor T3, a fourth transistor T4 and a fifth transistor T5.

Herein, a gate of the first transistor T1 is connected to the second clock signal terminal CKB, a first electrode thereof is connected to the first power supply signal terminal VGH, and a second electrode thereof is connected to a first node P1.

A gate of the second transistor T2 is connected to the first node P1, a first electrode thereof is connected to the first clock signal terminal CK, and a second electrode thereof is connected to a gate of the third transistor T3; a first electrode of the third transistor T3 is connected to the first power supply signal terminal VGH, and a second electrode thereof is connected to the pull-down node PD.

A gate of the fourth transistor T4 is connected to the pull-up node PU, a first electrode thereof is connected to the second clock signal terminal CKB, and a second electrode thereof is connected to the first node P1.

A gate of the fifth transistor T5 is connected to the pull-up node PU, a first electrode thereof is connected to the second power supply signal terminal VGL, and a second electrode thereof is connected to the pull-down node PD.

When the pull-up node PU is at the first potential, the fourth transistor T4 and the fifth transistor T5 of the control sub-circuit 20 are turned on, to output a second power supply signal from the second power supply signal terminal VGL to the pull-down node PD; and when the second clock signal output by the second clock signal terminal CKB is at the second potential, and the first clock signal output by the first clock signal terminal CK is at the first potential, the first node P1 is at the first potential, the second transistor T2 and the third transistor T3 of the control sub-circuit 20 are turned on, to output the first power supply signal from the first power supply signal terminal VGH to the pull-down node PD, wherein the first power supply signal is at the first potential, and the second power supply signal is at the second potential.

According to the embodiment of the present disclosure, the noise reduction sub-circuit 30 can comprise: a sixth transistor T6, a seventh transistor T7 and an eighth transistor T8.

Herein, a gate of the sixth transistor T6 is connected to the pull-down node PD, a first electrode thereof is connected to the second power supply signal terminal VGL, and a second electrode thereof is connected to the pull-up node PU.

A gate of the seventh transistor T7 is connected to the pull-down node PD, a first electrode thereof is connected to the second power supply signal terminal VGL, and a second electrode thereof is connected to the output terminal OUT.

A gate of the eighth transistor T8 is connected to the second clock signal terminal CKB, a first electrode thereof is connected to the second power supply signal terminal VGL, and a second electrode thereof is connected to the output terminal OUT.

When the pull-down node PD is at the first potential, the noise reduction sub-circuit 30 outputs the second power supply signal to the pull-up node PU and the output terminal OUT, so as to reduce the noise of the pull-up node PU and the output terminal OUT. Or, when the second clock signal terminal CKB is at the first potential, the noise reduction sub-circuit 30 outputs the second power supply signal to the output terminal OUT, so as to reduce noise of the output terminal OUT.

Further, according to the embodiment of the present disclosure, by referring to FIG. 2, the input sub-circuit 10 can comprise: a ninth transistor T9 and a tenth transistor T10; the output sub-circuit 40 can comprise: an eleventh transistor T11 and a capacitor C1.

A gate of the ninth transistor T9 is connected to the input signal terminal IN, a first electrode thereof is connected to the first control signal terminal CN, and a second electrode thereof is connected to the pull-up node PU.

A gate of the tenth transistor T10 is connected to the reset signal terminal RST, a first electrode thereof is connected to the second control signal terminal CNB, and a second electrode thereof is connected to the pull-up node PU.

When the input signal output by the input signal terminal IN is at the first potential, the input sub-circuit 10 outputs the first control signal from the first control signal terminal CN to the pull-up node PU, and thus can charge the pull-up node PU.

When a reset signal output by the reset signal terminal RST is at the first potential, the input sub-circuit 10 outputs the second control signal from the second control signal terminal CNB to the pull-up node PU, and thus can reset the pull-up node PU.

A gate of the eleventh transistor T11 is connected to the pull-up node PU, a first electrode thereof is connected to the first clock signal terminal CK, and a second electrode thereof is connected to the output terminal OUT.

One terminal of the capacitor C1 is connected to the pull-up node PU, and another terminal thereof is connected to the output terminal OUT.

When the pull-up node PU is at the first potential, the output sub-circuit 40 outputs the first clock signal to the output terminal OUT as a gate driving signal to drive one row of pixel circuit.

To sum up, there is provided in the embodiment of the present disclosure a shift register unit. The shift register unit comprises the control sub-circuit and the noise reduction sub-circuit. The control sub-circuit can control the potential of the pull-down node at the first potential when the first clock signal is at the first potential; the noise reduction sub-circuit can control the potential of the output terminal at the second potential when the pull-down node or the second clock signal is at the first potential. Since frequencies of the first clock signal and the second clock signal are the same and phases thereof are opposite, the control sub-circuit and the noise reduction sub-circuit can control the potential of the output terminal constantly at the second potential after the output phase of the shift register unit, so as to effectively reduce noise of the output terminal. In addition, only one capacitor is applied in the shift register unit provided in the embodiment of the present disclosure, so that the circuit structure is simple, its occupation area is relatively small, and thus it is easy to realize a narrow frame design of a display panel.

Figure 3:
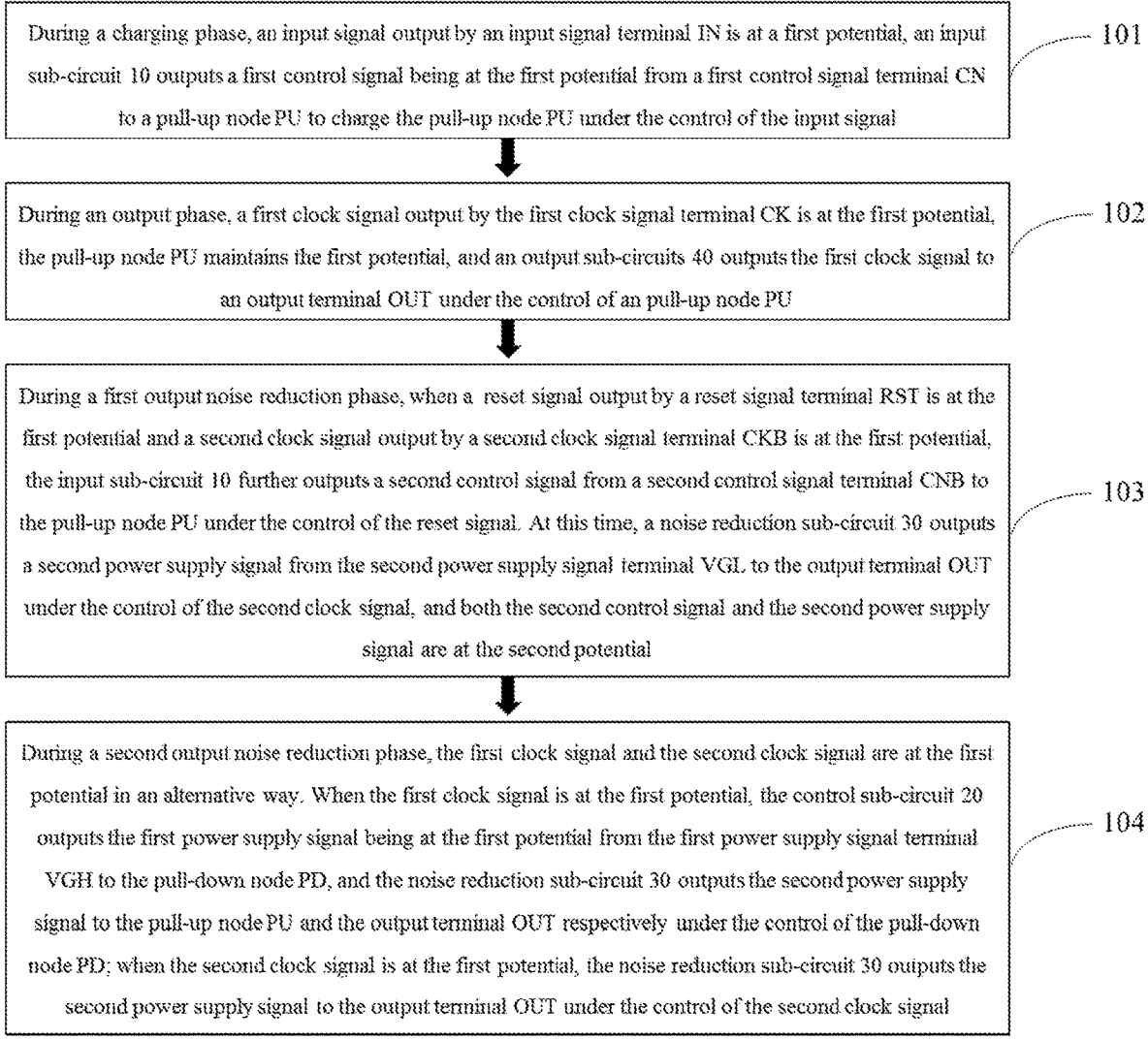
FIG. 3 is a flow diagram of a driving method of a shift register unit provided in an embodiment of the present disclosure.

There is provided in an embodiment of the present disclosure a driving method of a shift register unit. The method can be used to drive the shift register unit as shown in FIG. 1 or FIG. 2. By referring to FIG. 1, the shift register unit comprises: the input sub-circuit 10, the control sub-circuit 20, the noise reduction sub-circuit 30 and the output sub-circuit 40; by referring to FIG. 3, the method can comprise the following steps.

At step 101, during a charging phase, the input signal output by the input signal terminal IN is at the first potential, the input sub-circuit 10 outputs the first control signal being at the first potential from the first control signal terminal CN to the pull-up node PU to charge the pull-up node PU under the control of the input signal. At the same time, during the charging phase, the control sub-circuit 20 outputs the second power supply signal from the second power supply signal terminal VGL to the pull-down node PD under the control of the pull-up node PU.

At step 102, during an output phase, the first clock signal output by the first clock signal terminal CK is at the first potential, the pull-up node PU maintains the first potential, and the output sub-circuits 40 outputs the first clock signal to the output terminal OUT under the control of the pull-up node PU. At the same time, during the output phase, the control sub-circuit 20 outputs the second power supply signal from the second power supply signal terminal VGL to the pull-down node PD under the control of the pull-up node PU.

At Noise reduction steps 103 and 104, during an output noise reduction phase, the first clock signal and the second clock signal are at the first potential in an alternative way. When the first clock signal is at the first potential, the control sub-circuit 20 outputs the first power supply signal being at the first potential from the first power supply signal terminal VGH to the pull-down node PD, and the noise reduction sub-circuit 30 outputs the second power supply signal to the pull-up node PU and the output terminal OUT respectively under the control of the pull-down node PD; when the second clock signal is at the first potential, the noise reduction sub-circuit 30 outputs the second power supply signal to the output terminal OUT under the control of the second clock signal.

Additionally, according to the embodiment of the present disclosure, when the input sub-circuit 10 is further connected to a reset signal terminal, during the step 103 of the output noise reduction phase (this phase can also be called as a first output noise reduction phase or the reset phase), when the reset signal output by the reset signal terminal RST is at the first potential and the second clock signal output by the second clock signal terminal CKB is at the first potential, the input sub-circuit 10 further outputs the second control signal from the second control signal terminal CNB to the pull-up node PU under the control of the reset signal. At this time, the noise reduction sub-circuit 30 outputs the second power supply signal from the second power supply signal terminal VGL to the output terminal OUT under the control of the second clock signal, and both the second control signal and the second power supply signal are at the second potential. During the step 104 of the output noise reduction phase (this phase can also be called as a second output noise reduction phase), the first clock signal and the second clock signal are at the first potential in an alternative way, and the reset signal output by the reset signal terminal RST is at the second potential.

Figure 4:
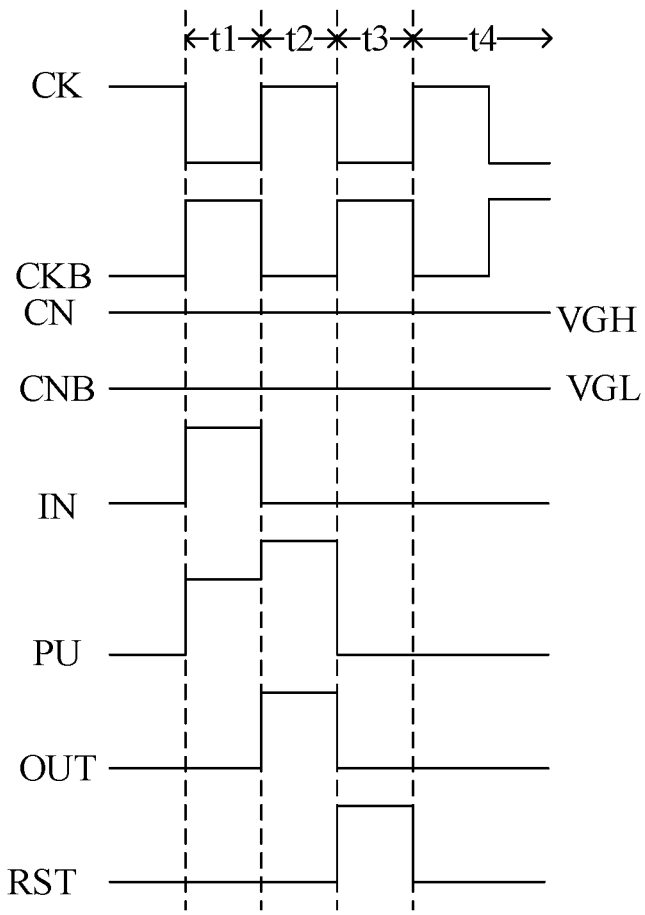
FIG. 4 is a timing diagram of a driving process of a shift register unit provided in an embodiment of the present disclosure.

FIG. 4 is a timing diagram of a driving process of a shift register unit provided in an embodiment of the present disclosure. By taking the shift register unit as shown in FIG. 2 as an example, the driving method of the shift register unit provided in the embodiment of the present disclosure will be introduced in detail. It shall be known that although connections of the input sub-circuit 10 and the reset signal input terminal RST are described in particular in the following description. However, according to the actual requirement, the reset signal input terminal RST and its corresponding operation can be omitted.

By combining with FIGS. 2 and 4, during the charging phase t1, the input signal output by the input signal terminal IN and the second clock signal output by the second clock signal terminal CKB are at the first potential, and the reset signal output by the reset signal terminal RST and the first clock signal output by the first clock signal terminal CK are at the second potential. At this time, the ninth transistor T9, the first transistor T1 and the eighth transistor T8 are turned on, and the first control signal terminal IN outputs the first control signal to one terminal of the capacitor C1 via the ninth transistor T9. It can be seen from FIG. 4 that the potential of the first control signal is the same as the potential of the first power supply signal terminal VGH, and both are at a high potential, and thus the capacitor C1 can be charged to pull up the potential of the pull-up node PU. At this time, the eleventh transistor T11, the fourth transistor T4 and the fifth transistor T5 are turned on, the first clock signal terminal CK outputs the first clock signal to the output terminal OUT, to pull down the potential of the output terminal OUT; the second power supply signal terminal VGL outputs the second power supply signal to the pull-down node PD via the fifth transistor T5, to pull down the potential of the pull-down node PD, so that the sixth transistor T6 and the seventh transistor T7 are turned off, which avoids from influencing the potential of the pull-up node PU.

Additionally, since the first transistor T1 and the fourth transistor T4 are turned on, the second clock signal and the first power supply signal drive the second transistor T2 to be turned on, the first clock signal terminal CK outputs the first clock signal which is at the second potential to the gate of the third transistor T3, so that the third transistor T3 is turned off. Therefore, the first power supply signal terminal VGH would not influence the potential of the pull-down node PD.

During the output phase t2, the input signal, the reset signal and the second clock signal are at the second potential, and the first transistor T1, the eighth to tenth transistors are in a turn-off state; the first clock signal output by the first clock signal terminal CK is at the first potential, the pull-up node PU does not have a discharging path and maintains the first potential, and the first clock signal terminal CK outputs the first clock signal to the output terminal OUT. In addition, since the fourth transistor T4 and the fifth transistor T5 maintain in the turn-on state, the pull-down node PD still maintains the second potential, the second clock signal terminal CKB outputs the second clock signal which is at the second potential to the first node P1 via the fourth transistor T4, the second transistor T2 is turned off, the first clock signal which is at the first potential and output by the first clock signal terminal CK cannot act on the gate of the third transistor T3 via the second transistor T2, and the third transistor T3 still maintains the turn-off state of the previous phase, so that the sixth transistor T6 and the seventh transistor T7 still maintain in the turn-off state, which avoids from influencing the potential of the pull-up node PU and the output terminal OUT.

During the first output noise reduction phase t3 (reset phase t3), signals output by the reset signal terminal RST and the second clock signal terminal CKB are at the first potential, signals output by the input signal terminal IN and the first clock signal terminal CK are at the second potential, the ninth transistor T9 is turned off, and the first transistor T1, the eighth transistor T8 and the tenth transistor T10 are turned on. The second control signal terminal CNB outputs the second control signal to the pull-up node PU. It can be seen from FIG. 4 that the potential of the second control signal is equal to the potential of the second power supply signal terminal VGL, and both are the low potential, and thus the pull-up node PU can be reset. At this time, the fourth transistor T4 and the fifth transistor T5 are turned off. The first transistor T1 is turned on and the first power supply signal terminal VGH drives the second transistor T2 to be turned on, but the first clock signal output by the first clock signal terminal CK is at the second potential at this time, so that the third transistor T3 is still in the turn-off state. Since the eighth transistor T8 is turned on, the second clock signal terminal CKB outputs the second clock signal which is at the second potential to the output terminal OUT, so as to reset the output terminal OUT.

During a subsequent second output noise reduction phase t4, the reset signal output by the reset signal terminal RST maintains the second potential, and the first clock signal output by the first clock signal terminal CK and the second clock signal output by the second clock signal terminal CKB are at the first potential in an alternative way. The gate (i.e., the first node P1) of the second transistor 12 maintains the state of the previous phase because there is no low level to pull down and it utilizes its own gate-source capacitor, so that the second transistor T2 would always maintain the turn-on state, and the first clock signal terminal CK constantly outputs the first clock signal to the gate of the third transistor T3. When the first clock signal is at the first potential, the third transistor T3 is turned on, the first power supply signal terminal VGH outputs the first power supply signal to the pull-down node PD, the sixth transistor T6 and the seventh transistor T7 are turned on, and the second power supply signal terminal VGL outputs the second power supply signal to the pull-up node PU and the output terminal OUT respectively; when the second clock signal is at the first potential, the eighth transistor T8 is turned on, and the second power supply signal terminal VGL outputs the second power supply signal to the output terminal OUT.

During the second output noise reduction phase, frequencies of clock signals output by the two clock signal terminals CK and CKB are the same and phases thereof are opposite. Therefore, respective transistors in the noise reduction sub-circuit 30 can constantly reduce noise of the output terminal OUT, which effectively improves the noise reduction performance of the shift register unit.

Figure 5:
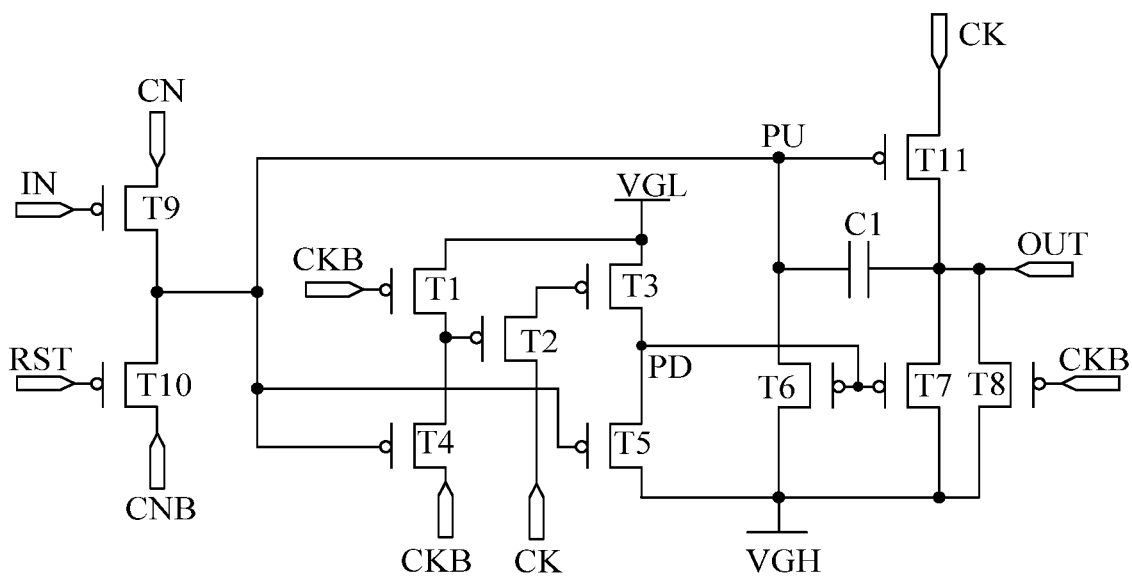
FIG. 5 is a schematic diagram of a structure of another shift register unit provided in an embodiment of the present disclosure.
Figure 6:
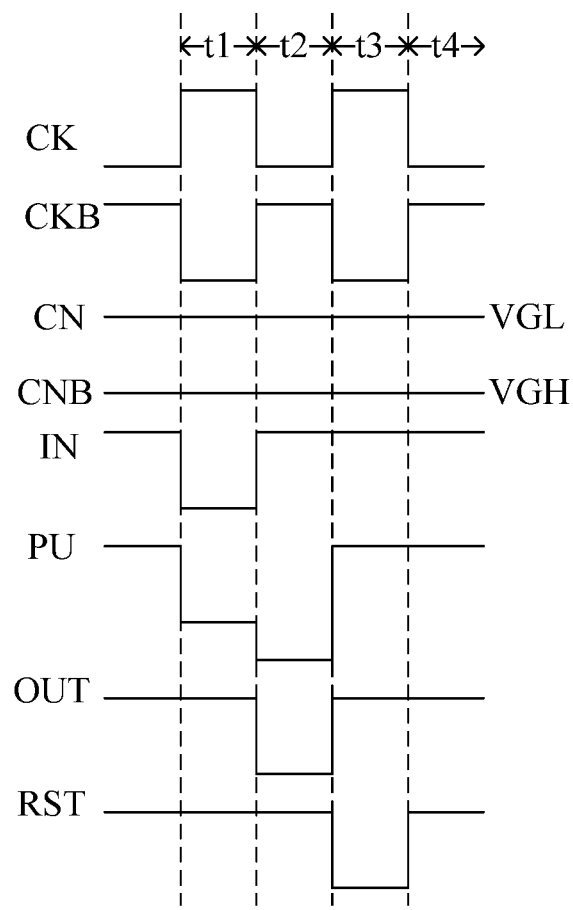
FIG. 6 is a timing diagram of a driving process of another shift register unit provided in an embodiment of the present disclosure.

It needs to specify that the above embodiments are described by taking respective transistors being N type transistors and the first potential being at the high potential relative to the second potential as an example. Of course, as shown in FIG. 5, these respective transistors can also adopt the P type transistors. When the respective transistors adopt the P type transistors, connection relationships between respective transistors may maintain unchanged; however, since the first power supply signal output by the first power supply signal terminal VGH is the high level and the second power supply signal output by the second power supply signal terminal VGL is the low level, it can be seen from a comparison of FIGS. 2 and 5 that only positions of the two signal terminals need to be exchanged with each other. In addition, when respective transistors adopt P type transistors, the first potential may be the low potential relative to the second potential, and timing diagrams of respective signal terminals can be shown in FIG. 6. It can be seen from FIG. 6 that change in potentials of respective signal terminals may be opposite to change in potentials as shown in FIG. 4 (i.e., a phase difference of the two is 180 degrees).

To sum up, there is provided in the present disclosure the driving method of the shift register unit. During the output noise reduction phase, when the first clock signal is at the first potential, the control sub-circuit can control the potential of the pull-down node at the first potential, and the noise reduction sub-circuit can reduce noise of the pull-up node and the output terminal under the control of the pull-down node; when the second clock signal is at the first potential, the noise reduction sub-circuit can directly reduce noise of the output terminal. Frequencies of the first clock signal and the second clock signal are the same and phases thereof are opposite, so that it could make that the potential of the output terminal of the shift register unit continues to be at the second potential after the output phase, so as to guarantee effective noise reduction of the output terminal.

Figure 7:
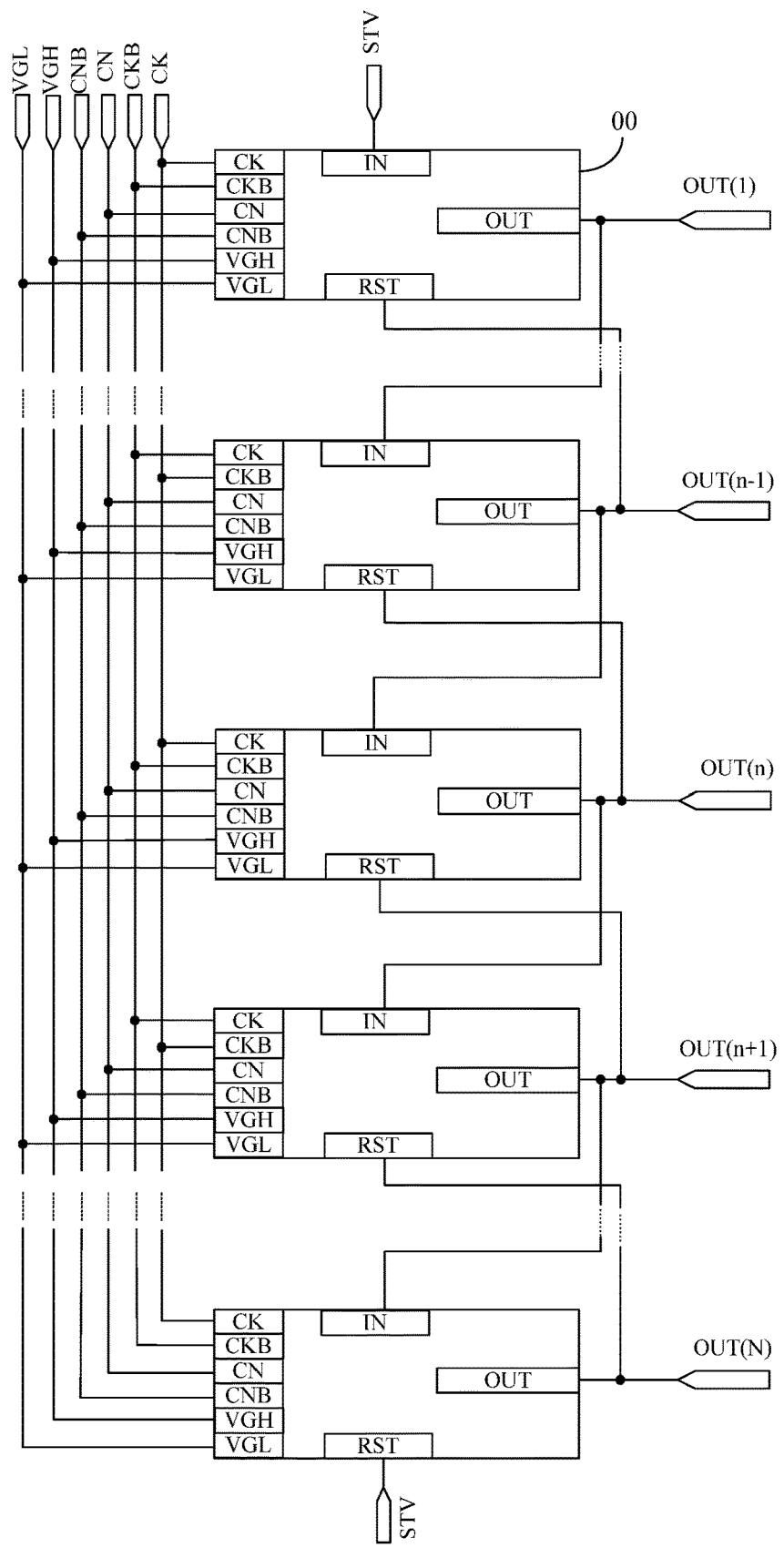
FIG. 7 is a schematic diagram of a structure of a gate driving circuit provided in an embodiment of the present disclosure.

FIG. 7 is a schematic diagram of a structure of a gate driving circuit provided in an embodiment of the present disclosure. By referring to FIG. 7, the gate driving circuit can comprise at least two shift register units 00 connected in cascades, wherein each shift register unit may be the shift register unit as shown in FIG. 1, FIG. 2 or FIG. 5.

It can be seen from FIG. 7 that an input signal terminal IN of each stage of shift register unit is connected to an output terminal OUT of a previous stage of shift register unit; a reset signal terminal RST of each stage of shift register unit is connected to an output terminal OUT of a next stage of shift register unit, for example, an input signal terminal IN of a n-th stage of shift register unit is connected to an output terminal OUT(n−1) of a (n−1)-th stage of shift register unit, a reset signal terminal RST of the n-th stage of shift register unit is connected to the output terminal OUT(n+1) of the (n+1)-th stage of shift register unit. It can be seen from FIG. 7 that in the gate driving circuit, an input signal terminal IN of a first stage of shift register unit and a reset signal terminal RST of a last stage of shift register unit can be connected to a frame synchronization signal terminal STV. In addition, by controlling the first control signal terminal CN and the second control signal terminal CNB, it can make that respective shift register units in the gate driving circuit realize backward and forward bilateral scanning of the display apparatus.

For example, when the first control signal terminal CN outputs the first control signal which is at the first potential and the second control signal terminal CNB outputs the second control signal which is at the second potential, it can make that respective shift register units in the gate driving circuit are turned on starting from a first stage of shift register unit in sequence, and thus forward scanning of the display apparatus can be realized. When the first control signal terminal CN outputs the first control signal which is at the second potential, and the second control signal terminal CNB outputs the second control signal which is at the first potential, it can make that respective shift register units in the gate driving circuit are turned on starting from a last stage of shift register unit in sequence, and thus backward scanning of the display apparatus can be realized.

There is further provided in the embodiment of the present disclosure a display apparatus. The display apparatus can comprise the gate driving circuit as shown in FIG. 7. The display apparatus may be any product or means having the function of displaying such as a liquid crystal panel, an electronic paper, an OLED panel, an AMOLED panel, a low temperature poly-silicon (LTPS) display panel, a mobile phone, a tablet computer, a television set, a display, a notebook computer, a digital photo frame, a navigator, etc.

Those skilled in the art can know clearly that for the purpose of convenient and brief description, specific operation processes of the shift register units and respective sub-circuits described above can refer to the corresponding processes of the above method embodiments, and thus no further details are given herein.

The above descriptions are just preferable embodiments of the present disclosure, but are not used to limit the present disclosure. Any amendment, equivalent replacement, and improvement and so on made by those skilled in the art within the spirit and principle of the present disclosure shall be included within the protection scope of the present disclosure.

What is claimed is:

1. A shift register unit, comprising:
an input sub-circuit, connected to an input signal terminal, a first control signal terminal and a pull-up node respectively, and configured to output a first control signal from said first control signal terminal to said pull-up node when an input signal output by said input signal terminal is at a first potential;
a control sub-circuit, connected to said pull-up node, a first clock signal terminal, a second clock signal terminal, a first power supply signal terminal, a second power supply signal terminal and a pull-down node respectively, and configured to output a second power supply signal from said second power supply signal terminal to said pull-down node when said pull-node is at the first potential, and to output a first power supply signal from said first power supply signal terminal to the pull-down node when a first clock signal output by said first clock signal terminal is at the first potential;
a noise reduction sub-circuit, connected to said pull-down node, said second clock signal terminal, said second power supply signal terminal and an output terminal respectively, and configured to output said second power supply signal to said output terminal when said pull-down node or a second clock signal output by said second clock signal terminal is at the first potential; and
an output sub-circuit, connected to said first clock signal terminal, said pull-up node and said output terminal respectively, and configured to output said first clock signal to said output terminal when said pull-up node is at the first potential,
wherein said first power supply signal is at the first potential, said second power supply signal is at a second potential, and frequencies of said first clock signal and said second clock signal are the same and phases thereof are opposite.

2. The shift register unit according to claim 1, wherein the input sub-circuit is further connected to a reset signal terminal and a second control signal terminal, and configured to output a second control signal from said second control signal terminal to said pull-up node when a reset signal output by said reset signal terminal is at the first potential,
wherein said first control signal is at the first potential, and said second control signal is at the second potential.

3. The shift register unit according to claim 2, wherein the input sub-circuit comprises: a ninth transistor and a tenth transistor;
a gate of said ninth transistor is connected to said input signal terminal, a first electrode thereof is connected to said first control signal terminal, and a second electrode thereof is connected to said pull-up node;
a gate of said tenth transistor is connected to said reset signal terminal, a first electrode thereof is connected to said second control signal terminal, and a second electrode thereof is connected to said pull-up node.

4. The shift register unit according to claim 1, wherein said noise reduction sub-circuit is connected to said pull-up node, and configured to output said second power supply signal to said pull-up node when said pull-down node is at the first potential.

5. The shift register unit according to claim 4, wherein the noise reduction sub-circuit comprises: a sixth transistor, a seventh transistor and an eighth transistor;
a gate of said sixth transistor is connected to said pull-down node, a first electrode thereof is connected to said second power supply signal terminal, and a second electrode thereof is connected to said pull-up node;
a gate of said seventh transistor is connected to said pull-down node, a first electrode thereof is connected to said second power supply signal terminal, a second electrode thereof is connected to said output terminal;
a gate of said eighth transistor is connected to said second clock signal terminal, a first electrode thereof is connected to said second power supply signal terminal, and a second electrode thereof is connected to said output terminal.

6. The shift register unit according to claim 1, wherein said control sub-circuit comprises: a first transistor, a second transistor, a third transistor, a fourth transistor and a fifth transistor;
a gate of said first transistor is connected to said second clock signal terminal, a first electrode thereof is connected to said first power supply signal terminal, and a second electrode thereof is connected to a first node;
a gate of said second transistor is connected to the first node, a first electrode thereof is connected to said first clock signal terminal, and a second electrode thereof is connected to a gate of said third transistor;
a first electrode of said third transistor is connected to said first power supply signal terminal, and a second electrode thereof is connected to said pull-down node;
a gate of said fourth transistor is connected to said pull-up node, a first electrode thereof is connected to said second clock signal terminal, and a second electrode thereof is connected to said first node;
a gate of said fifth transistor is connected to said pull-up node, a first electrode thereof is connected to said second power supply signal terminal, and a second electrode thereof is connected to said pull-down node.

7. The shift register unit according to claim 1, wherein the output sub-circuit comprises: an eleventh transistor and a capacitor;
a gate of said eleventh transistor is connected to said pull-up node; a first electrode thereof is connected to said first clock signal terminal, and a second electrode thereof is connected to said output terminal;
one terminal of said capacitor is connected to said pull-up node, and another terminal thereof is connected to said output terminal.

8. A gate driving circuit, comprising:
at least two shift register units according to claim 1 connected in cascades.

9. A display apparatus, comprising: the gate driving circuit according to claim 8.

10. A driving method of a shift register unit, wherein the shift register unit comprises; an input sub-circuit; a control sub-circuit, a noise reduction sub-circuit and an output sub-circuit; the driving method comprises:
during a charging phase, an input signal terminal outputting an input signal being at a first potential, said input sub-circuit outputting a first control signal from a first control signal terminal being at a first potential to a pull-up node to charge said pull-up node under the control of said input signal;
during an output phase, a first clock signal terminal outputting a first clock signal being at the first potential, said pull-up node maintaining the first potential, and said output sub-circuit outputting said first clock signal to an output terminal under the control of the pull-up node;
during an output noise reduction phase, said first clock signal and said second clock signal being at the first potential in an alternative way; when said first clock signal is at the first potential, said control sub-circuit outputting a first power supply signal being at the first potential from a first power supply signal terminal to said pull-down node, and said noise reduction sub-circuit outputting said second power supply signal to said output terminal under the control of said pull-down node; when said second clock signal is at the first potential, said noise reduction sub-circuit outputting said second power supply signal to said output terminal under the control of said second clock signal.

11. The driving method according to claim 10, wherein during the output noise reduction phase, when a reset signal terminal outputs a reset signal being at the first potential and said second clock signal terminal outputs a second clock signal being at the first potential, said input sub-circuit outputs a second control signal from a second control signal terminal to said pull-up node under the control of said reset signal, said noise reduction sub-circuit outputs a second power supply signal from a second power supply signal terminal to said output terminal under the control of said second clock signal, and both said second control signal and said second power supply signal are at a second potential.

12. The driving method according to claim 10, wherein said control sub-circuit comprises: a first transistor, a second transistor, a third transistor, a fourth transistor and a fifth transistor; said noise reduction sub-circuit comprises: a sixth transistor, a seventh transistor and an eighth transistor; during said output noise reduction phase, said first clock signal and said second clock signal are at the first potential in an alternative way, said second transistor maintains in a turn-on state, said first dock signal terminal outputs said first clock signal to a gate of said third transistor; when said first dock signal is at the first potential, said third transistor is turned on, said first power supply signal terminal outputs said first power supply signal to said pull-down node, said sixth transistor and said seventh transistor are turned on, and said second power supply signal terminal outputs said second power supply signal to said pull-up node and said output terminal respectively; when said second clock signal is at the first potential, said eighth transistor is turned on, and said second power supply signal terminal outputs said second power supply signal to said output terminal.

13. The driving method according to claim 12, wherein all transistors are N type transistors, and said first potential is at a high potential relative to said second potential.

* * * * *